(12) United States Patent
Zhang et al.

(10) Patent No.: US 10,763,369 B2
(45) Date of Patent: Sep. 1, 2020

(54) THIN FILM TRANSISTOR AND METHOD FOR MANUFACTURING THE SAME, ARRAY SUBSTRATE AND DISPLAY APPARATUS

(71) Applicants: BOE TECHNOLOGY GROUP CO., LTD., Beijing (CN); HEFEI BOE DISPLAY TECHNOLOGY CO., LTD., Hefei, Anhui (CN)

(72) Inventors: Ji Zhang, Beijing (CN); Tao Jiang, Beijing (CN); Guanglong Guo, Beijing (CN); Jincheng Gao, Beijing (CN); Guanbao Hui, Beijing (CN)

(73) Assignees: BOE TECHNOLOGY GROUP CO., LTD., Beijing (CN); HEFEI BOE DISPLAY TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 16/108,910

(22) Filed: Aug. 22, 2018

(65) Prior Publication Data

US 2019/0181271 A1    Jun. 13, 2019

(30) Foreign Application Priority Data

Dec. 12, 2017   (CN) .......................... 2017 1 1320018

(51) Int. Cl.
*H01L 29/786*   (2006.01)
*H01L 29/423*   (2006.01)
(Continued)

(52) U.S. Cl.
CPC .... *H01L 29/78633* (2013.01); *H01L 27/1218* (2013.01); *H01L 29/41733* (2013.01);
(Continued)

(58) Field of Classification Search
CPC ......... H01L 29/78633; H01L 29/66742; H01L 29/41733; H01L 29/42384; H01L 29/7869; H01L 27/1218
See application file for complete search history.

(56) References Cited

U.S. PATENT DOCUMENTS

2009/0261332 A1    10/2009  Shin et al.
2013/0043475 A1*   2/2013   Kim .................. H01L 29/78633
                                                      257/59

(Continued)

FOREIGN PATENT DOCUMENTS

CN          104752489 A      7/2015

OTHER PUBLICATIONS

First Office Action dated Dec. 4, 2019, for corresponding Chinese application 201711320018.X.

*Primary Examiner* — Su C Kim
(74) *Attorney, Agent, or Firm* — Nath, Goldberg & Meyer; Joshua B. Goldberg; Stephanie F. Majkut

(57) ABSTRACT

A thin film transistor, a method for manufacturing a thin film transistor, an array substrate and a display apparatus are provided. The thin film transistor includes a gate, a source, a drain and an active layer provided on a base substrate, both the source and the drain are electrically connected to the active layer, at least one of the source, the drain and the gate is a light-absorbing electrode, which comprises an electrode body and a light-absorbing layer, and the light-absorbing layer is arranged at a side of the electrode body facing towards the active layer.

8 Claims, 16 Drawing Sheets

(51) Int. Cl.
*H01L 27/12* (2006.01)
*H01L 29/417* (2006.01)
*H01L 29/66* (2006.01)

(52) U.S. Cl.
CPC .. *H01L 29/42384* (2013.01); *H01L 29/66742* (2013.01); *H01L 29/7869* (2013.01)

(56) References Cited

U.S. PATENT DOCUMENTS

| | | | |
|---|---|---|---|
| 2014/0326982 A1* | 11/2014 | Hayashida | C08L 63/00 257/40 |
| 2015/0129783 A1* | 5/2015 | Kondo | G01T 1/20 250/588 |
| 2017/0148862 A1 | 5/2017 | Xu | |

\* cited by examiner

THIN FILM TRANSISTOR AND METHOD FOR MANUFACTURING THE SAME, ARRAY SUBSTRATE AND DISPLAY APPARATUS

CROSS-REFERENCE TO RELATED APPLICATIONS

The present application claims the priority to the Chinese Patent Application No. 201711320018.X, filed on Dec. 12, 2017, to the Chinese Intellectual Property Office, the contents of which are incorporated herein in their entirety by reference.

TECHNICAL FIELD

The present disclosure relates to the field of semiconductor device, and in particular, to a thin film transistor and a method for manufacturing a thin film transistor, an array substrate and a display apparatus.

BACKGROUND

Currently, amorphous silicon and low temperature polysilicon (UPS) are usually used in a semiconductor device. However, most silicon-based semiconductor devices are sensitive to light, and are prone to generate off-state current under light to affect stability of the devices.

SUMMARY

The present disclosure provides a thin film transistor, a method for manufacturing a thin film transistor, an array substrate and a display apparatus.

The thin film transistor includes a gate, a source, a drain and an active layer provided on a base substrate, both the source and the drain are electrically connected to the active layer, at least one of the source, the drain and the gate is a light-absorbing electrode, which includes an electrode body and a light-absorbing layer, and the light-absorbing layer is arranged at a side of the electrode body facing towards the active layer.

In an embodiment, each of the gate, the source and the drain is the light-absorbing electrode, the light-absorbing layer of which is a conductive layer.

In an embodiment, the light-absorbing layer includes at least one of a reduced graphite oxide film, a carbon film, a poly (3,4-ethylenedioxythiophene):polystyrene sulfonic acid film, and a poly (3,4-ethylenedioxythiophene):polystyrene sulfonic acid-carbon black composite film.

In an embodiment, the gate is arranged between the active layer and the base substrate, and the source and the drain each are arranged at a side of the active layer away from the base substrate.

In an embodiment, the gate, the source and the drain each are arranged at a side of the active layer away from the base substrate.

In an embodiment, a thickness of the reduced graphite oxide film or the carbon film is between about 30 nm and about 100 nm; and a thickness of the poly (3,4-ethylenedioxythiophene):polystyrene sulfonic acid film or the poly (3,4-ethylenedioxythiophene):polystyrene sulfonic acid-carbon black composite film is between about 100 nm and about 200 nm.

In an embodiment, a material of light-absorbing layers of the source and the drain is different from that of the gate.

The method for manufacturing a thin film transistor includes forming a gate, an active layer, a source and a drain on a base substrate such that the source and the drain each are electrically connected to the active layer, and at least one of the gate, the source and the drain is a light-absorbing electrode, and the light-absorbing electrode is formed by forming an electrode body, and forming a light-absorbing layer at a side of the electrode body facing towards the active layer.

In an embodiment, each of the gate, the source and the drain is the light-absorbing electrode, the light-absorbing layer of which is a conductive layer.

In an embodiment, the light-absorbing layer includes at least one of a reduced graphite oxide film, a carbon film, a poly (3,4-ethylenedioxythiophene):polystyrene sulfonic acid film, and a poly (3,4-ethylenedioxythiophene):polystyrene sulfonic acid-carbon black composite film.

In an embodiment, the light-absorbing layer includes the reduced graphite oxide film, and the step of forming the light-absorbing layer includes following steps: forming a graphite oxide film; and processing the graphite oxide film in a reduction method to obtain the reduced graphite oxide film.

In an embodiment, the reduction method includes an annealing method or a hydrazine hydrate reduction method.

In an embodiment, an annealing temperature in the annealing method is between about 300° C. and about 400° C.

In an embodiment, when the light-absorbing layer includes the carbon film, the step of forming the light-absorbing layer includes forming the carbon film by magnetron sputtering.

In an embodiment, when the light-absorbing material layer includes the poly(3,4-ethylenedioxythiophene):polystyrene sulfonic acid film, the step of forming the light-absorbing layer includes following steps: preparing poly (3,4-ethylenedioxythiophene)-polystyrene sulfonic acid aqueous solution; coating the poly (3,4-ethylenedioxythiophene)-polystyrene sulfonic acid aqueous solution; and curing the coated poly (3,4-ethylenedioxythiophene)-polystyrene sulfonic acid aqueous solution to form the poly (3,4-ethylenedioxythiophene):polystyrene sulfonic acid film.

In an embodiment, when the light-absorbing material layer includes a poly(3,4-ethylenedioxythiophene):polystyrene sulfonic acid-carbon black composite film, the step of forming the light-absorbing material layer includes following steps: preparing carbon black mixture solution which includes poly(3,4-ethylenedioxythiophene)-polystyrene sulfonic acid dispersion, carbon black and dopant, the dopant including ethylene glycol or glycerol; coating the carbon black mixture solution; and curing the coated carbon black mixture solution to form the poly (3,4-ethylenedioxythiophene):polystyrene sulfonic acid carbon black composite film.

In an embodiment, the gate is formed before the active layer is formed, and the source and the drain each are formed after the active layer is formed.

In an embodiment, the gate, the source and the drain are all formed after the active layer is formed.

The array substrate includes the above thin film transistor and a pixel electrode electrically connected to the drain of the thin film transistor.

The display apparatus includes the above array substrate and a backlight,

BRIEF DESCRIPTION OF THE DRAWINGS

Drawings are provided to make a person skilled in the art better understand the present disclosure, and constitute a part of the description. The drawings are used to interpret the present disclosure together with embodiments of the present disclosure, and will not limit the present disclosure.

DETAILED DESCRIPTION

Figure 1:
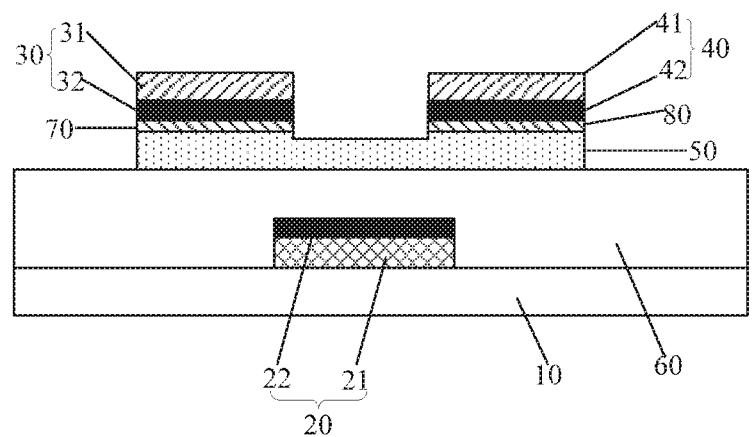
FIG. 1 is a schematic view of a structure of a thin film transistor according to an embodiment of the present disclosure.

In order to make a person skilled in the art better understand the technical solution in the present disclosure, the specific implementations of the present disclosure will be described in detail below in conjunction with the drawings.

In an aspect of the present disclosure, a thin film transistor is provided. FIGS. 1 to 6 illustrate schematic diagrams of six different structures of thin film transistors, respectively. As shown in FIGS. 1 to 6, each of the thin film transistors includes a gate 20, a source 30, a drain 40 and an active layer 50 provided on a base substrate 10, and both the source 30 and the drain 40 are electrically connected to the active layer 50. At least one of the gate 20, the source 30 and the drain 40 is a light-absorbing electrode, the light-absorbing electrode includes an electrode body and a light-absorbing layer, and the absorbing layer is provided at a side of the electrode body facing towards the active layer 50.

In the thin film transistor of the present disclosure, at least one of the gate, the source and the drain is the light-absorbing electrode in which the electrode body is provided with the light-absorbing layer at a side of the electrode body facing the active layer. Thus, when light irradiates towards the light-absorbing electrode, the light will be absorbed by the light-absorbing layer to prevent light from being reflected onto the active layer. Thus, with at least one of the gate, the source and the drain being the light-absorbing electrode, light may be prevented from being reflected onto the active layer, an off-state current of the thin film transistor may be reduced, and the stability of the thin film transistor may be improved. Accordingly, the stability of an array substrate and a display apparatus including the thin film transistor may be improved, and the display effect may be improved.

Figure 2:
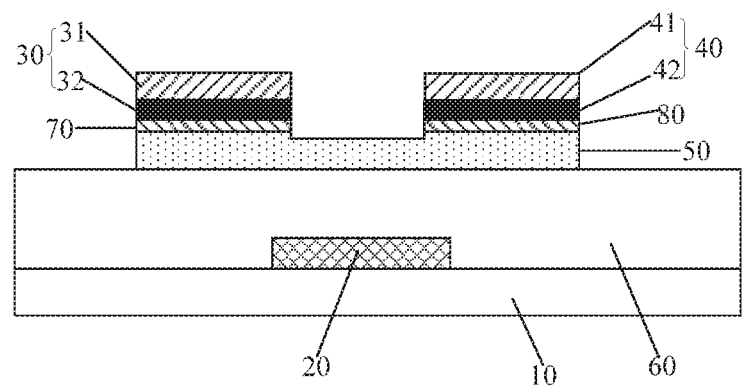
FIG. 2 is a schematic view of a structure of a thin film transistor according to an embodiment of the present disclosure.
Figure 3:
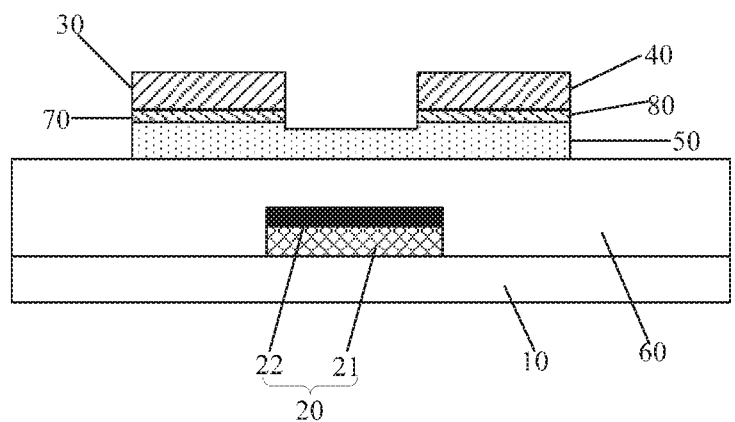
FIG. 3 is a schematic view of a structure of a thin film transistor according to an embodiment of the present disclosure.
Figure 4:
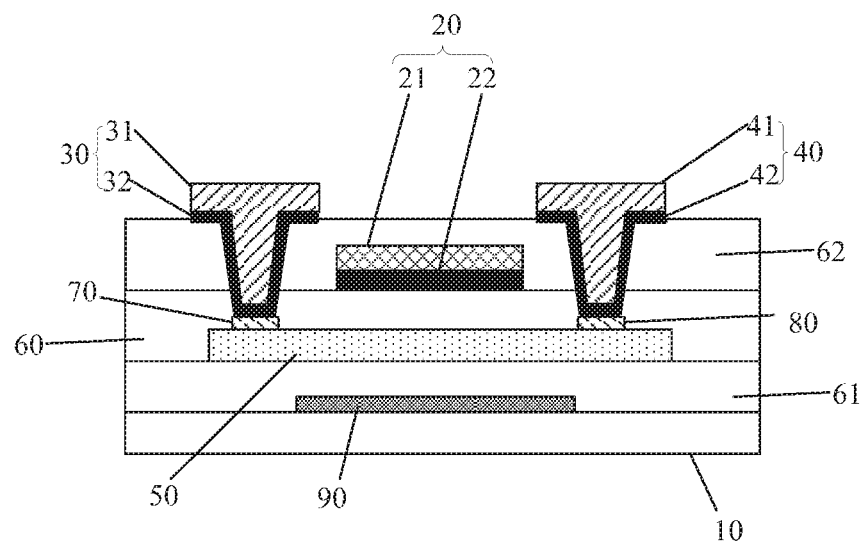
FIG. 4 is a schematic view of a structure of a thin film transistor according to an embodiment of the present disclosure.
Figure 5:
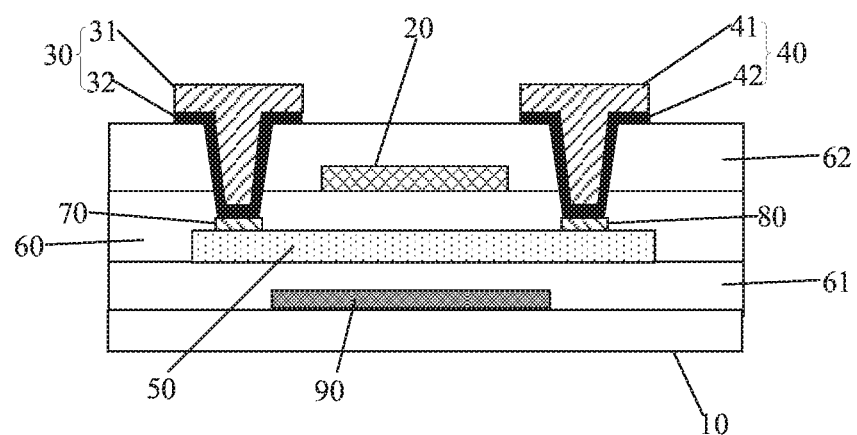
FIG. 5 is a schematic view of a structure of a thin film transistor according to an embodiment of the present disclosure.
Figure 6:
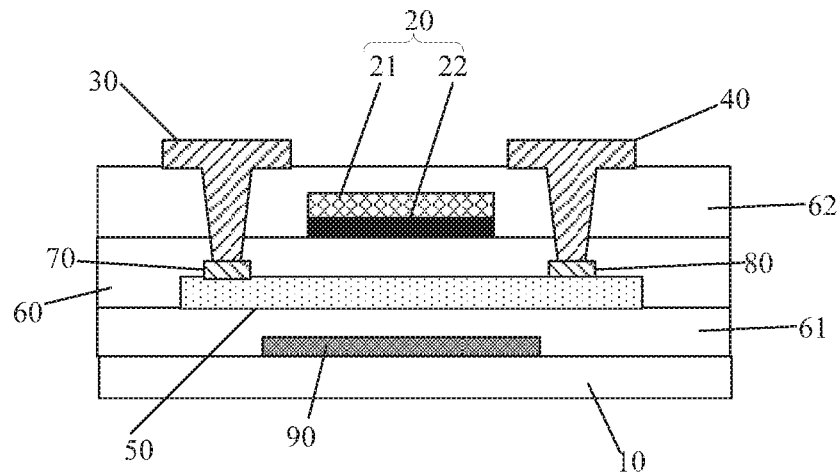
FIG. 6 is a schematic view of a structure of a thin film transistor according to an embodiment of the present disclosure.

As shown in FIGS. 1 and 4, each of the gate 20, the source 30 and the drain 40 is the light-absorbing electrode, the gate 20 includes an electrode body 21 and a light-absorbing layer 32; the source 30 includes an electrode body 31 and a light-absorbing layer 32; the drain 40 includes an electrode body 41 and a light-absorbing layer 42. Certainly, it is also possible that not all of the gate 20, the source 30 and the drain 40 are the light-absorbing electrodes. For example, as shown in FIGS. 2 and 5, the source 30 and the drain 40 are the light-absorbing electrodes, and the gate 20 is not the light-absorbing electrode; alternatively, as shown in FIGS. 3 and 6, the gate 20 is the light-absorbing electrode, and the source 30 and the drain 40 are not the light-absorbing electrodes. It should be noted that, any of the gate 20, the source 30 and the drain 40, which is not the light-absorbing electrode, only includes the electrode body without including the light-absorbing layer. It should also be noted that, when the source 30 and the drain 40 are the light-absorbing electrodes, the light-absorbing layers 32 and 42 of the source 30 and the drain 40 should not affect an electrical connection between the source 30, the drain 40 and the active layer 50.

The thin film transistor may be used in an array substrate of a display apparatus, and the array substrate may be located at a light-outcoming side of a backlight. In the prior art, the gate, the source and the drain are usually made of metal with good conductivity, and thus a surface of the gate, the source or the drain may have a light-reflecting effect. Thus, when the gate is arranged below the active layer to block light, or a light-blocking layer is arranged below the active layer, although the light from the backlight may be prevented from being directly irradiated onto the active layer, there is still a part of the light from the backlight or an ambient environment being reflected onto the active layer by the gate, the source or the drain, and thus the off-state current of the thin film transistor may be increased and the stability of the thin film transistor is reduced.

In the present disclosure, since at east one of the gate 20, the source 30 and the drain 40 is the light-absorbing electrode of which the electrode body is provided with the light-absorbing layer at the side thereof facing towards the active layer 50. When light is irradiated onto the light-absorbing electrode, the light-absorbing layer may absorb the light, and prevent the light from being reflected onto the active layer 50. Thus, with at least one of the gate, the source and the drain being the light-absorbing electrode, light may be prevented from being reflected on the active layer 50, the off-state current of the thin film transistor is reduced and the stability of the thin film transistor is improved.

In an embodiment of the present disclosure, the thin film transistor is of a bottom-gate type. As shown in FIGS. 1 to 3, the gate 20 is arranged between the active layer 50 and the base substrate 10, a gate insulation layer 60 is arranged between the gate 20 and the active layer 50, and the source 30 and the drain 40 each are arranged at a side of the active layer 50 away from the base substrate 10. Thus, the gate 20 may block light which is directly irradiated onto the active layer 50 by the backlight, and the light-blocking layer may be omitted. The detailed structure of the thin film transistor may be described below taking the thin film transistor being of a bottom-gate type as an example.

In order to prevent light from being irradiated onto the active layer 50 to the largest extent, as shown in FIG. 1, each of the gate 20, the source 30 and the drain 40 is the light-absorbing electrode, and each of the light-absorbing layer 22 of the gate 20, the light-absorbing layer 32 of the source 30 and the light-absorbing layer 42 of the drain 40 is the conductive layer. Thus, it is not necessary to configure the gate insulation layer between the gate 20 and the active layer 50 with a large thickness, which ensures that the on-state current of the thin film transistor is not affected.

In the present disclosure, the light-absorbing layer may include at least one of a reduced graphite oxide film, a carbon film, a poly (3,4-ethylenedioxythiophene):polystyrene sulfonic acid film (i.e., PEDOT:PSS film), and a poly (3,4-ethylenedioxythiophene):polystyrene sulfonic acid-carbon black composite film (PEDOT: PSS-C composite film).

In order to simply the manufacturing procedure, the light-absorbing layer may include any one of the above four films. Moreover, in order to ensure that the light-absorbing layer has a good conductivity and a good light-absorbing ability, when the light-absorbing layer includes the reduced graphite oxide film, a thickness of the reduced graphite oxide film is between 30 nm and 100 nm; when the light-absorbing layer includes the carbon film, a thickness of the carbon film is between 30 nm and 100 nm; when the light-absorbing layer includes the poly (3,4-ethylenedioxy-thiophene):polystyrene sulfonic acid film, the thickness of the poly (3,4-ethylenedioxythiophene):polystyrene sulfonic acid film is between 100 nm and 200 nm; and when the light-absorbing layer includes the poly (3,4-ethylenedioxy-thiophene):polystyrene sulfonic acid-carbon black composite film, the thickness of the poly (3,4-ethylenedioxythio-phene):polystyrene sulfonic acid-carbon black composite film is between 100 nm and 200 nm.

Further, as shown in FIGS. 1 to 3, a first ohmic contact layer 70 is arranged between the source 30 and the active layer 50, a second ohmic contact layer 80 is arranged between the drain 40 and the active layer 50, and the source 30 and the drain 40 are electrically connected to the active layer 50 via the first ohmic contact layer 70 and the second ohmic contact layer 80, respectively, so that ohmic contacts are formed between the source 30, the drain 40 and the active layer 50, and contact resistances between the source 30, the drain 40 and the active layer 50 may be reduced.

The above embodiment is described for the thin film transistor of the bottom-gate type. Certainly, the thin film transistor may be of a top-gate type. As shown in FIGS. 4 to 6, the gate 20, the source 30 and the drain 40 are all arranged at a side of the active layer 50 away from the base substrate 10, the gate insulation layer 60 is arranged between the gate 20 and the active layer 50, a second intermediate dielectric layer 62 is arranged above the gate 20, and both the source 30 and the drain 40 are electrically connected to the active layer 50 by via holes passing through the second intermediate dielectric layer 62 and the gate insulation layer 60.

Similar to the thin film transistor of the bottom-gate type, in the thin film transistor of the top-gate type, any one of the gate 20, the source 30 and the drain 40 may be provided as a light-absorbing electrode. As shown in FIG. 6, only the gate 20 is the light-absorbing electrode. Alternatively, any two of the gate 20, the source 30 and the drain 40 may be provided as the light-absorbing electrodes, and as shown in FIG. 5, the source 30 and the drain 40 are provided as the light-absorbing electrodes. In an embodiment, as shown in FIG. 4, each of the gate 20, the source 30 and the drain 40 is the light-absorbing electrode.

In the thin film transistor of the top-gate type, the light-absorbing layer in each light-absorbing electrode may include at least one of a reduced graphite oxide film, a carbon film, a poly (3,4-ethylenedioxythiophene):polystyrene sulfonic acid film (i.e., PEDOT:PSS film), and a poly (3,4-ethylenedioxythiophene):polystyrene sulfonic acid-carbon black composite film (PEDOT: PSS-C composite film).

In addition, in the thin film transistor of the top-gate type, since the gate 20 is provided above the active layer 50, the gate 20 cannot block light from a bottom side of the base substrate 10 (for example, light from the backlight of the display apparatus). In order to block the light from the bottom side of the base substrate 10, as shown in FIGS. 4 to 6, a light-blocking layer 90 may be arranged at a side of the active layer 50 facing towards the base substrate 10, and a first intermediate dielectric layer 61 is arranged between the light-blocking layer 90 and the active layer 50. The light-blocking layer 90 may be made of a material the same as that of the above light-absorbing layer, or, the light-blocking layer 90 may be made of other light-absorbing material. When the light-blocking layer 90 is made of an insulating material, the first intermediate dielectric layer 61 may be omitted.

As another aspect of the present disclosure, a method for manufacturing a thin film transistor is provided, and the method may include a step of forming a gate, an active layer, a source and a drain such that both the source and the drain are electrically connected to the active layer.

At least one of the gate, the source and the drain is a light-absorbing electrode, which is formed by forming an electrode body and forming a light-absorbing layer at a side of the electrode body facing towards the active layer.

As described above, the thin film transistor may be of a bottom-gate type or a top-gate type. When the thin film transistor is of the gate-bottom type, the gate is formed before the source and the drain are formed, and the source and the drain are formed after the active layer is formed. When the thin film transistor is of the top-gate type, the gate, the source and the drain are formed after the active layer is formed.

In particular, the light-absorbing layer may include at least one of a reduced graphite oxide film, a carbon film, a poly (3,4-ethylenedioxythiophene):polystyrene sulfonic acid film (i.e., PEDOT:PSS film), and a poly (3,4-ethylenedioxythiophene):polystyrene sulfonic acid-carbon black composite film (PEDOT: PSS-C composite film).

The method for manufacturing the thin film transistor will be described in detail below taking the thin film transistor of the bottom-gate type as an example.

Figure 7:
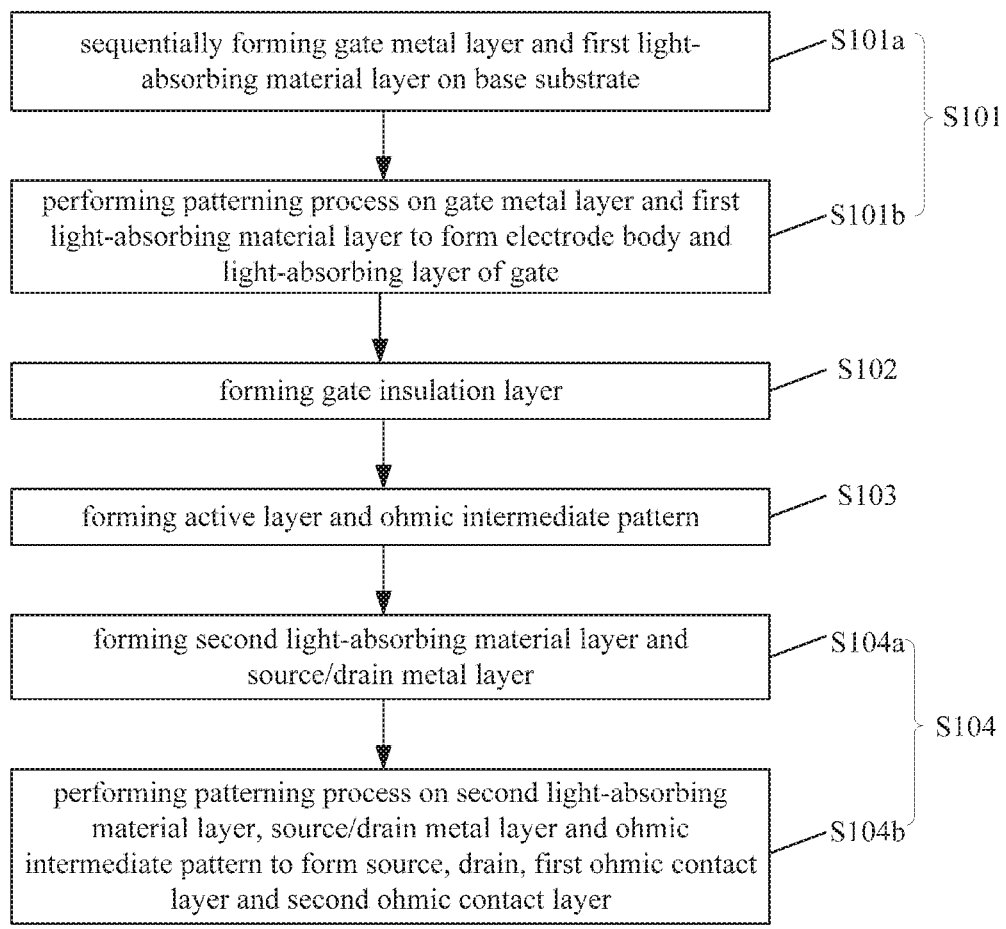
FIG. 7 is a flow chart illustrating a method for manufacturing the thin film transistor shown in FIG. 1 according to an embodiment of the present disclosure.

FIG. 7 is a flow chart illustrating the method for manufacturing the thin film transistor shown in FIG. 1, and FIGS. 8a to 8h are schematic views of structures formed by various steps of the method for manufacturing the thin film transistor. In the thin film transistor, each of the gate 20, the source 30 and the drain 40 is the light-absorbing electrode to prevent light from being irradiated onto the active layer to the largest extent. The light-absorbing layer is a conductive layer to facilitate the electrical connection between the source 30, the drain 40 and the active layer 50, and prevent the gate insulation layer between the gate 20 and the active layer 50 from affecting the on-state current due to a large thickness thereof. As shown in FIGS. 7 and 8a to 8h, the method for manufacturing the thin film transistor shown in FIG. 1 includes steps S101 to S104.

Figure 8A:
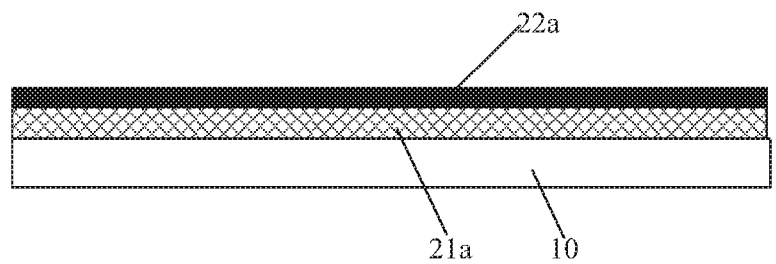
FIGS. 8a to 8h are schematic views illustrating structures formed by various steps of the method for manufacturing the thin film transistor shown in FIG. 1 according to an embodiment of the present disclosure.

At step S101, the gate 20 is formed. The step S101 specially includes forming the electrode body 21 of the gate 20 and forming the light-absorbing layer 22 of the gate 20. In order to simply the manufacturing procedure, the electrode body 21 and the light-absorbing layer 21 of the gate 20 are formed by steps S101a and S101b with a single patterning process, At step S101a, a gate metal layer 21a and a first light-absorbing material layer 22a are sequentially formed on the base substrate 10, as shown in FIG. 8a.

For example, the gate metal layer 21a may include a metal layer made of any one of Cr, Cu and Al or a composite film made of more than one of Cr, Cu and Al. The first light-absorbing material layer 22a includes at least one of a reduced graphite oxide film, a carbon film, a poly (3,4-ethylenedioxythiophene):polystyrene sulfonic acid film (i.e., PEDOT:PSS film), and a poly (3,4-ethylenedioxythiophene):polystyrene sulfonic acid-carbon black composite film (PEDOT:PSS-C composite film).

When the first light-absorbing material layer 22a includes the reduced graphite oxide film, a graphite oxide film (GO) may be first formed by a low-cost liquid-phase technology such as inkjet printing, screen printing and micro-contact printing; then, the graphite oxide film may be processed in a reduction method to obtain the reduced graphite oxide film; the reduction method may be a direct annealing method (the annealing temperature may be between 300° C.~400° C.), or a hydrazine hydrate reduction method, etc.

When the first light-absorbing material layer 22a includes the carbon film, the carbon film may be formed by magnetron sputtering with high purity graphite as a carbon source.

When the first light-absorbing material layer 22a includes the poly(3,4-ethylenedioxythiophene):polystyrene sulfonic acid film, the first light-absorbing material layer 22a may be formed by: preparing poly (3,4-ethylenedioxythiophene)-polystyrene sulfonic acid aqueous solution; then coating the poly (3,4-ethylenedioxythiophene)-polystyrene sulfonic acid aqueous solution on the gate metal layer 21a; and then curing the coated poly (3,4-ethylenedioxythiophene)-polystyrene sulfonic acid aqueous solution to form the poly (3,4-ethylenedioxythiophene):polystyrene sulfonic acid film.

When the first light-absorbing material layer 22a includes a poly (3,4-ethylenedioxythiophene):polystyrene sulfonic acid-carbon black composite film, the first light-absorbing material layer 22a may be formed by: preparing carbon black mixture solution, the carbon mixed solution including poly (3,4-ethylenedioxythiophene)-polystyrene sulfonic acid dispersion, carbon black and dopant, the dopant including ethylene glycol or glycerol, the weight of the dopant accounting for 3%-10% of the total weight of the carbon black mixture solution to increase the conductivity and reduce the viscosity; then coating the carbon black mixture solution on the gate metal layer 21a; and then curing the coated carbon black mixture solution to form the poly (3,4-ethylenedioxythiophene):polystyrene sulfonic acid carbon black composite film.

In order to simply the manufacturing procedure, the first light-absorbing material layer 22a may include at least one of a reduced graphite oxide film, a carbon film, a poly (3,4-ethylenedioxythiophene):polystyrene sulfonic acid film (i.e., PEDOT:PSS film); and a poly (3,4-ethylenedioxythiophene):polystyrene sulfonic acid-carbon black composite film (PEDOT:PSS-C composite film). In order to ensure good light absorbability and prevent an excessive channel resistance, when the reduced graphite oxide film or the carbon film is used, a thickness of the first light-absorbing material layer 22a is controlled to be between 30 nm and 100 nm, for example, between 50 nm and 100 nm; when the poly (3,4-ethylenedioxythiophene):polystyrene sulfonic acid film or the poly (3,4-ethylenedioxythiophene):polystyrene sulfonic acid-carbon black composite film is used, the thickness of the first light-absorbing material layer 22a is controlled to be between 100 nm and 200 nm.

Figure 8B:
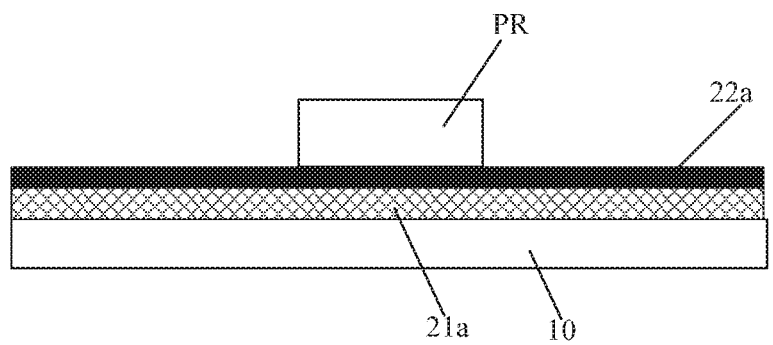
Figure 8C:
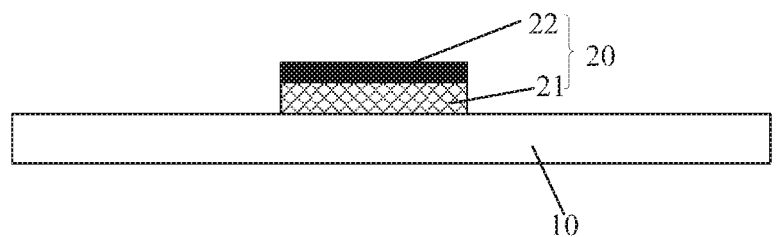

At step S101b, a patterning process is performed on the gate metal layer 21a and the first light-absorbing material layer 22a to form the electrode body 21 and the light-absorbing layer 22 of the gate 20, and the light-absorbing layer 22 is arranged at a side of the electrode body 21 facing towards the active layer 50, i.e. the light-absorbing layer 22 is arranged above the electrode body 12. The patterning process may include forming a photoresist layer, which is then exposed and developed to retain the photoresist PR at a region where the gate is located and to remove the photoresist in other regions, as shown in FIG. 8b; then a first etching (for example, a dry etching, in which the etching gas includes oxygen) is performed on the first light-absorbing material layer 22a to form the light-absorbing layer 22 of the gate 20, and then a second etching (for example, a wet etching) is performed on the gate metal layer 21a to form the electrode body 21 of the gate 20, as shown in FIG. 8c.

Figure 8D:
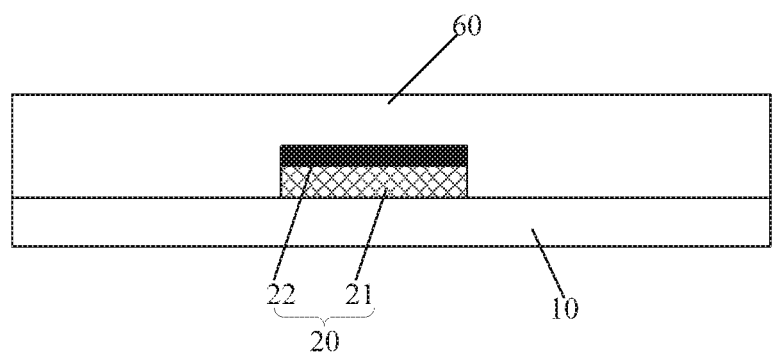

At step S102, a gate insulation layer 60 is formed, as shown in FIG. 8d.

Figure 8E:
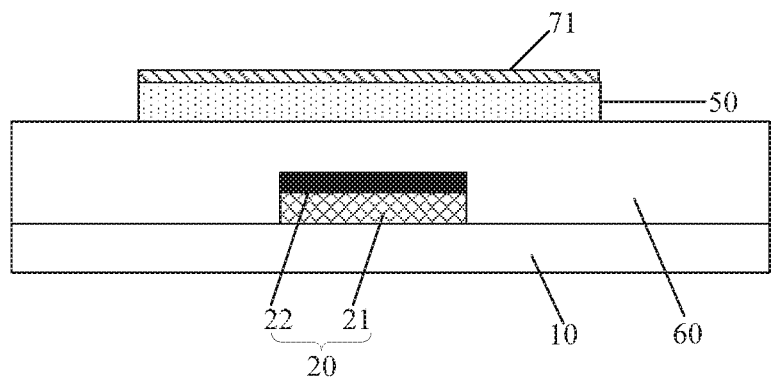

At step S103, an active layer 50 is formed, as shown in FIG. 8e.

As described above, the first ohmic contact layer 70 is arranged between the source 30 and the active layer 50 of the thin film transistor, and the second ohmic contact layer 80 is arranged between the drain 40 and the active layer 50, so as to reduce the contact resistances between the source 30, the drain 40 and the active layer 50. Accordingly, the method for manufacturing the thin film transistor further includes a step of forming the ohmic contact layers. In order to simply the manufacturing procedure, an ohmic intermediate pattern 71 may be formed while the active layer 50 is formed at the step S103, as shown in FIG. 8e. Then, when the source 30 and the drain 40 are formed, while the ohmic intermediate pattern 71 is etched to form the first ohmic contact layer 70 and the second ohmic contact layer 80.

For example, the step S103 may include sequentially forming a semiconductor layer (for example, an a-Si layer), an ohmic contact material layer (for example, an $n^+$ Si layer) and a photoresist layer; then performing an exposure process and a development process on the photoresist layer to retain the photoresist at a region corresponding to the active layer and remove the photoresist at other regions; then, performing an etching on the semiconductor layer and the ohmic contact material layer to form the active layer 50 and the ohmic intermediate pattern 71; finally removing remaining photoresist.

At step S104, the source 30 and the drain 40 are formed. Herein, the source 30 and the drain 40 are both the light-absorbing electrodes, and the electrode body 31 and the light-absorbing layer 32 of the source 30 and the electrode body 41 and the light-absorbing layer 42 of the drain 40 are formed by a single patterning process. The step S104 may include steps S104a and S104b.

Figure 8F:
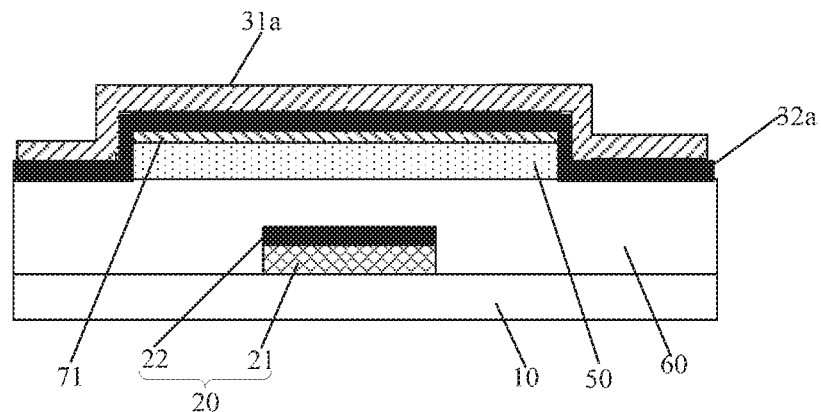

At step S104a, as shown in FIG. 8f, a second light-absorbing material layer 32a and a source/drain metal layer 31a are sequentially formed. Similar to the first light-absorbing material layer 22a, the second light-absorbing material layer 32a may include at least one of a reduced graphite oxide film, a carbon film, a poly (3,4-ethylenedioxythiophene):polystyrene sulfonic acid film, and a poly (3,4-ethylenedioxythiophene):polystyrene sulfonic acid-carbon black composite film. Descriptions relating to how to form these films and thicknesses of these films may be referred to those as above for the first light-absorbing material layer 22a, and are omitted here. It should be noted that, the first light-absorbing material layer 22a and the second light-absorbing material layer 32a may be made of a same material or made of different materials respectively, which is not limited herein.

Figure 8G:
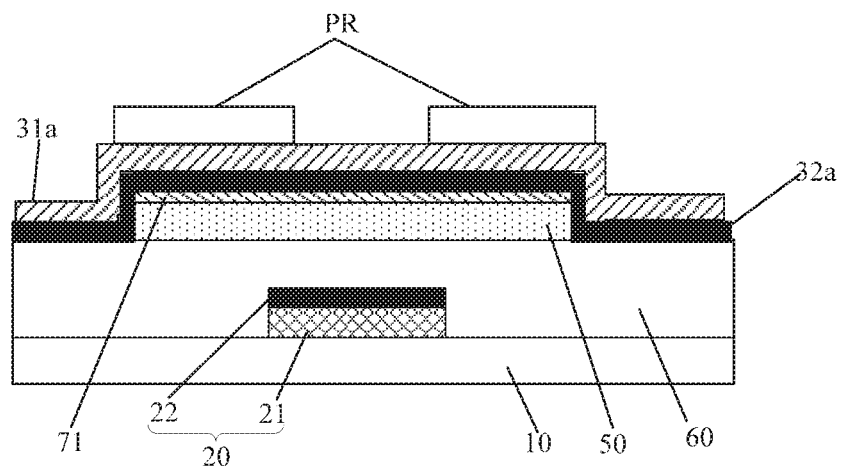
Figure 8H:
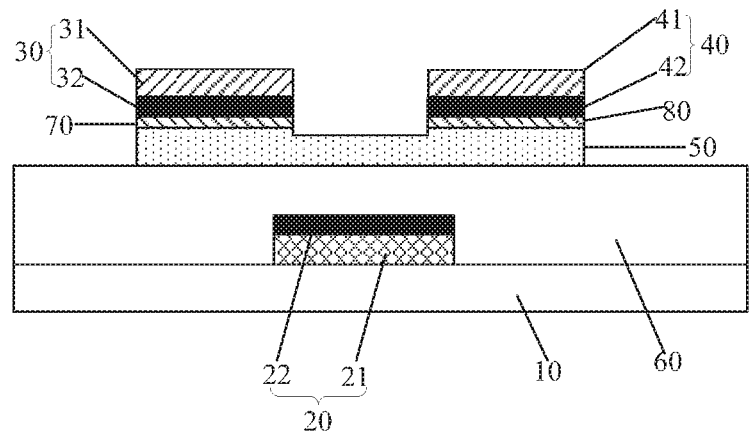

At step S104b, a patterning process is performed on the second light-absorbing material layer 32a, the source/drain metal layer 31a and the ohmic intermediate pattern 71, to form the source 30, the drain 40, the first ohmic contact layer 70 and the second ohmic contact layer 80. For example, a photoresist layer is formed on the source/drain metal layer 31a; then, an exposure process and a development process are performed on the photoresist layer to retain photoresist PR at regions corresponding to the source and the drain and remove photoresist at other regions, as shown in FIG. 8g; then the source/drain metal layer 31a, the second light-absorbing material layer 32a and the ohmic intermediate pattern 71 are etched; finally, remaining photoresist is removed, to form the electrode body 31 of the source 30, the electrode body 41 of the drain 40, the light-absorbing layer 32 of the source 30, the light-absorbing layer 42 of the drain 40, the first ohmic contact layer 70 and the second ohmic contact layer 80, as shown in FIG. 8h.

It should be noted that, the steps S103 and 104 may be performed simultaneously, and may include sequentially forming a semiconductor layer, an ohmic contact material layer, a second light-absorbing material layer 32a, a source/drain metal layer 31a and a photoresist layer; then performing a half exposure process and a development process on the photoresist layer so as to completely retain photoresist at regions corresponding to the source and the drain, retain a part of photoresist at a region between the regions corresponding to the source and the drain, and completely remove photoresist at other regions; then performing an etching on the source/drain metal layer 31a, the second light-absorbing material layer 32a, the ohmic contact material layer and the semiconductor layer to form the active layer 50, the ohmic intermediate pattern 71, a light-absorbing intermediate pattern and a source/drain intermediate patter; and then performing an asking process on the photoresist layer to thin the photoresist PR at the regions corresponding to the source and the drain and remove the photoresist at the region between the regions corresponding to the source and the drain; and then performing an etching on the source/drain intermediate pattern, the light-absorbing intermediate pattern and the ohmic intermediate pattern 71 to from the electrode body 31 of the source 30, the electrode body 41 of the drain 40, the light-absorbing layer 32 of the source 30, the light-absorbing layer 42 of the drain 40, the first ohmic contact layer 70 and the second ohmic contact layer 80.

Figure 9:
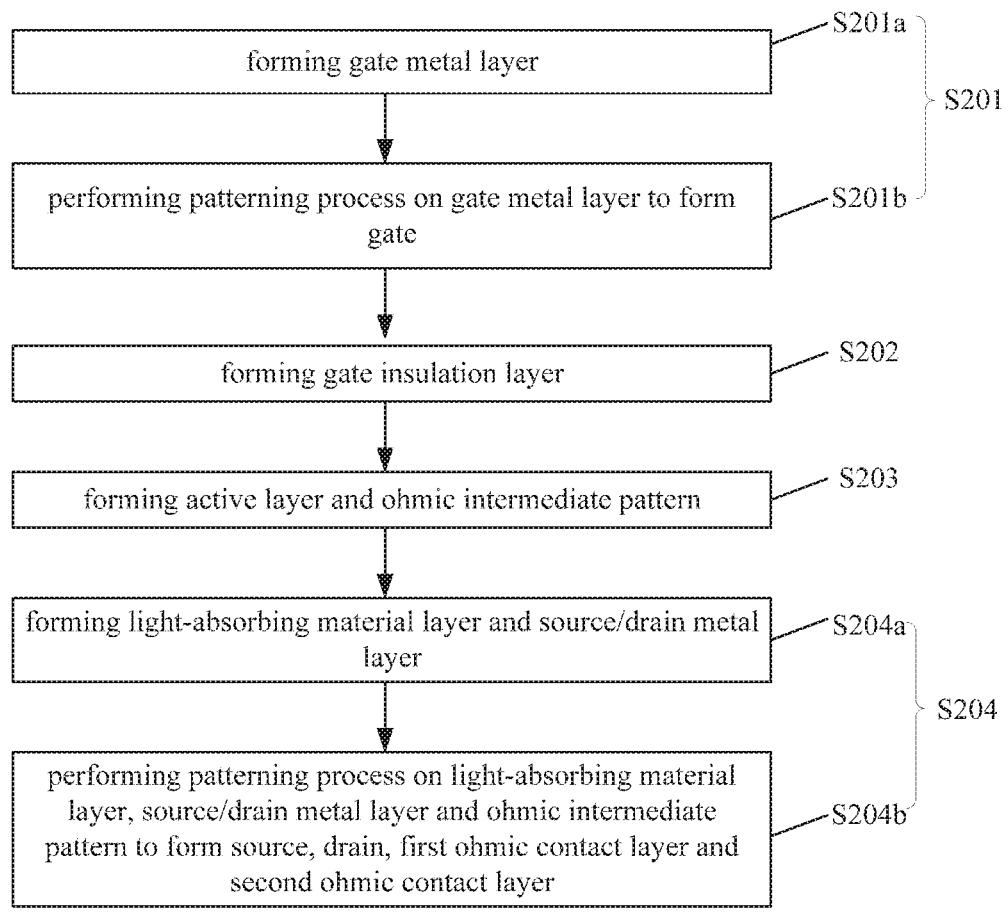
FIG. 9 is a flow chart illustrating a method fir manufacturing the thin film transistor shown in FIG. 2 according to an embodiment of the present disclosure.

FIG. 9 is a flow chart illustrating the method for manufacturing the thin film transistor shown in FIG. 2, and FIGS. 10a to 10g are schematic views of structures formed by various steps of the method for manufacturing the thin film transistor. In this method for manufacturing the thin film transistor, the source 30 and the drain 40 are both the light-absorbing electrodes, and the gate 20 is not the light-absorbing electrode. As shown in FIGS. 9 and 10a to 10g, the method for manufacturing the thin film transistor shown in FIG. 2 includes steps S201 to S204.

Figure 10A:
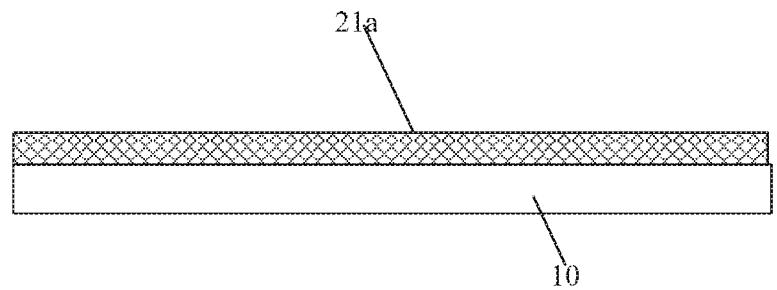
FIGS. 10a to 10g are schematic views illustrating structures formed by various steps of the method for manufacturing the thin film transistor shown in FIG. 2 according to an embodiment of the present disclosure.
Figure 10B:
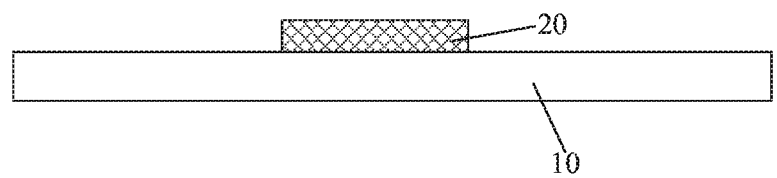

At step S201, the gate 20 is formed. In this method for manufacturing the thin film transistor, the gate 20 is not the light-absorbing electrode, and only includes an electrode body. Thus, the step S201 may include steps S201a and S201b. At step S201a, a gate metal layer 21a is thrilled, as shown in FIG. 10a, and a material of the gate metal layer 21a may be referred to that described for the step S101; at step S201b, a patterning process is performed on the gate metal layer 21a to form the gate 20, as shown in FIG. 10b.

Figure 10C:
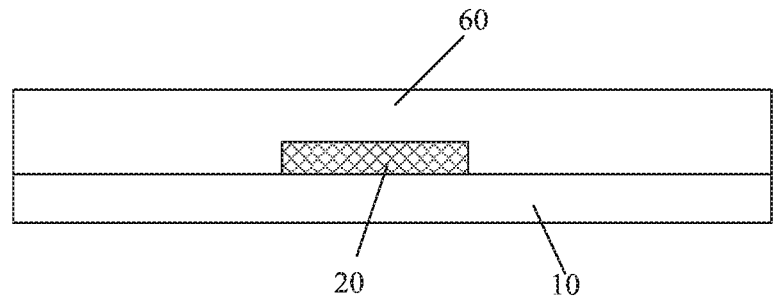

At step S202, a gate insulation layer 60 is formed, as shown in FIG. 10c.

Figure 10D:
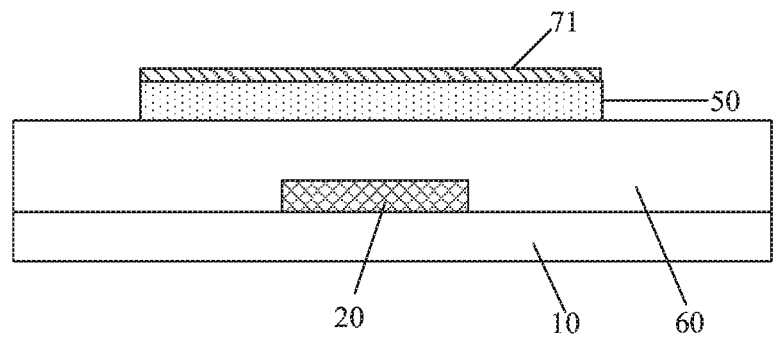

At step S203, an active layer 50 and an ohmic intermediate pattern 71 are formed, as shown in FIG. 10d. For example, the step S203 may include sequentially forming a semiconductor layer (for example, an a-Si layer), an ohmic contact material layer (for example, an Si layer) and a photoresist layer; then performing an exposure process and a development process on the photoresist layer to retain the photoresist at a region corresponding to the active layer and remove the photoresist at other regions; then, performing an etching on the semiconductor layer and the ohmic contact material layer to form the active layer 50 and the ohmic intermediate pattern 71; finally removing remaining photoresist.

At step S204, the source 30 and the drain 40 are formed. The step S204 is the same as the step S104 in the method for manufacturing the thin film transistor shown in FIG. 1, and may include steps S204a and S204b.

Figure 10E:
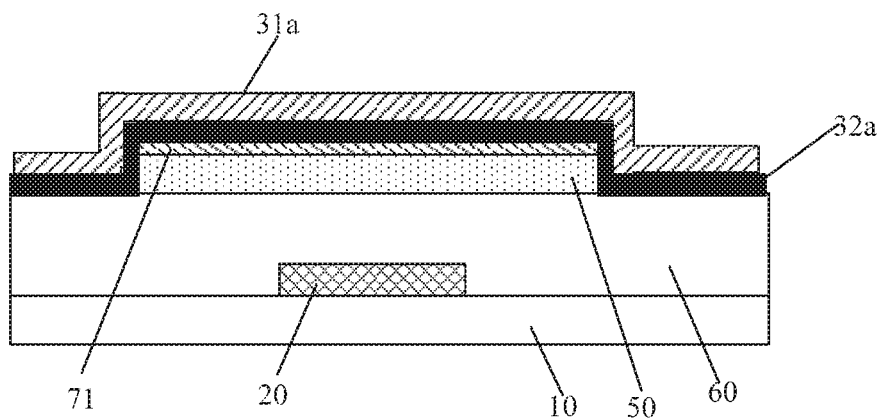

At step S204a, as shown in FIG. 10e, a light-absorbing material layer 32a and a source/drain metal layer 31a are sequentially formed. The light-absorbing material layer 32a may include at least one of a reduced graphite oxide film, a carbon film, a poly (3,4-ethylenedioxythiophene):polystyrene sulfonic acid film, and a poly (3,4-ethylenedioxythiophene):polystyrene sulfonic acid-carbon black composite film. Descriptions relating to how to form these films and thicknesses of these films may be referred to those as above for the first light-absorbing material layer 22a in the method for manufacturing the thin film transistor shown in FIG. 1, and are omitted here.

Figure 10F:
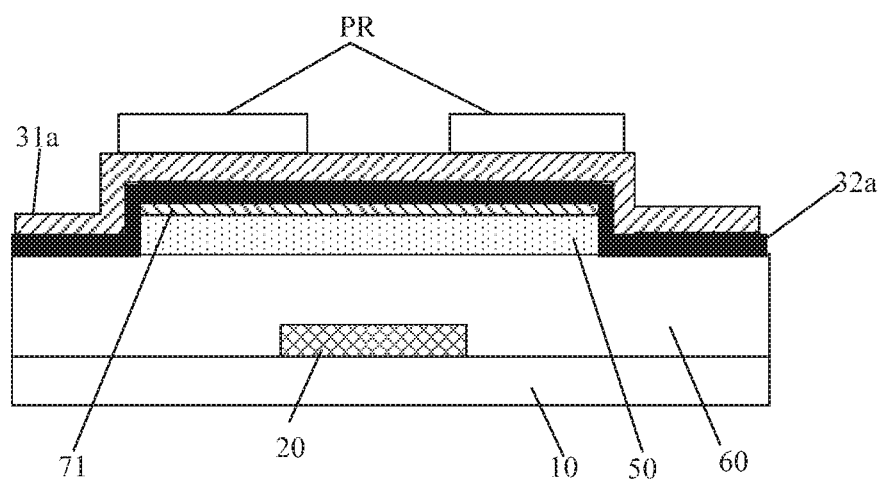
Figure 10G:
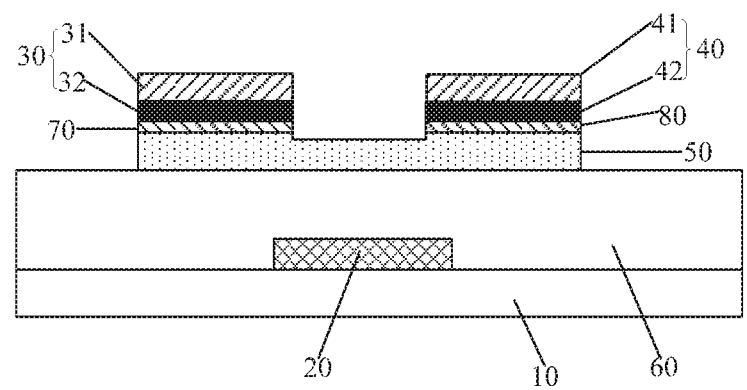

At step S204b, a patterning process is performed on the light-absorbing material layer 32a, the source/drain metal layer 31a and the ohmic intermediate pattern 71, to form the source 30, the drain 40, the first ohmic contact layer 70 and the second ohmic contact layer 80. For example, a photoresist layer is formed on the source/drain metal layer 31a; then, an exposure process and a development process are performed on the photoresist layer to retain photoresist PR at regions corresponding to the source and the drain and remove photoresist at other regions, as shown in FIG. 10f; then the source/drain metal layer 31a, the light-absorbing material layer 32a and the ohmic intermediate pattern 71 are etched; finally, remaining photoresist is removed, to form the electrode body 31 of the source 30, the electrode body 41 of the drain 40, the light-absorbing layer 32 of the source 30, the light-absorbing layer 42 of the drain 40, the first ohmic contact layer 70 and the second ohmic contact layer 80, as shown in FIG. 10g.

Figure 11:
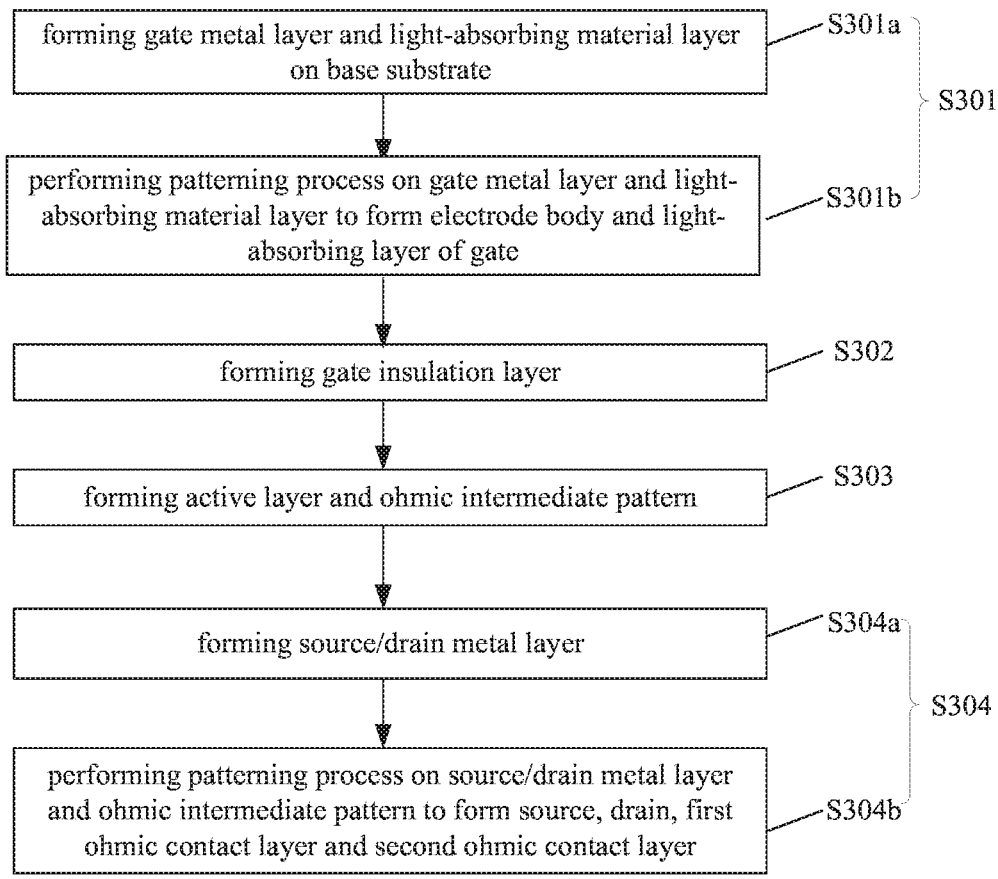
FIG. 11 is a flow chart illustrating a method for manufacturing the thin film transistor shown in FIG. 3 according to an embodiment of the present disclosure.

FIG. 11 is a flow chart illustrating the method for manufacturing the thin film transistor shown in FIG. 3, and FIGS.

12a to 12g are schematic views of structures formed by various steps of the method for manufacturing the thin film transistor. In the method for manufacturing the thin film transistor, the gate 20 is the light-absorbing electrode, and the source 30 and the drain 40 are not the light-absorbing electrodes. As shown in FIGS. 11 and 12a to 12g, the method for manufacturing the thin film transistor shown in FIG. 3 includes steps S301 to S304.

At step S301, the gate 20 is formed. The step S301 is the same as the step S101 in the method for manufacturing the thin film transistor shown in FIG. 1, and may include steps S301a and S301b.

Figure 12A:
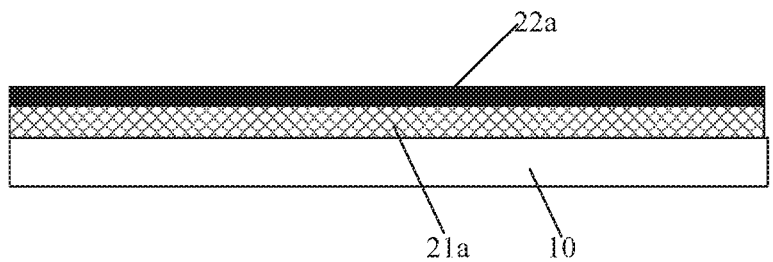
FIGS. 12a to 12g are schematic views illustrating structures formed by various steps of the method for manufacturing the thin film transistor shown in FIG. 3 according to an embodiment of the present disclosure.

At step S301a, a gate metal layer 21a and a light-absorbing material layer 22a are sequentially formed on the base substrate 10, as shown in FIG. 12a. Descriptions relating to a material of the gate metal layer 21a, how to form the light-absorbing material layer 22a and the thickness of the light-absorbing material layer 22a may be referred to those in the method for manufacturing the thin film transistor shown in FIG. 1, and are omitted herein.

Figure 12B:
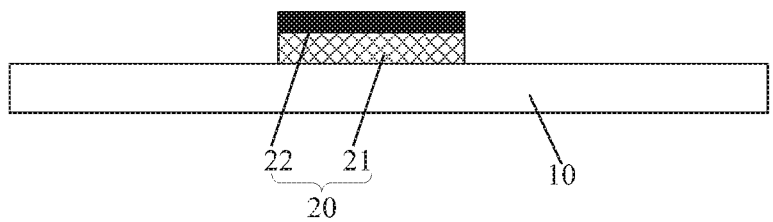

At step S301b, a patterning process is performed on the gate metal layer 21a and the light-absorbing material layer 22a to form the electrode body 21 and the light-absorbing layer 22 of the gate 20, and the light-absorbing layer 22 is arranged above the electrode body 12, as shown in FIG. 12b.

Figure 12C:
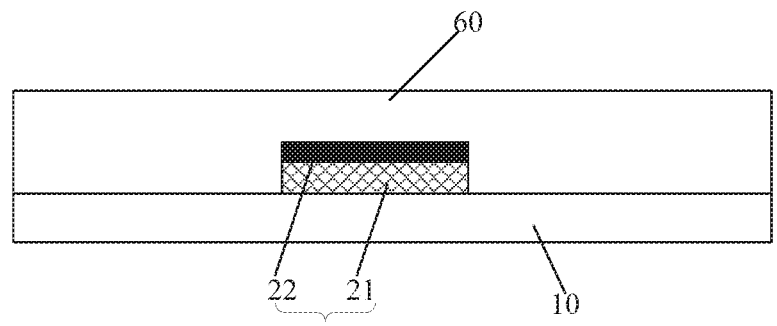

At step S302, a gate insulation layer 60 is formed, as shown in FIG. 12c.

Figure 12D:
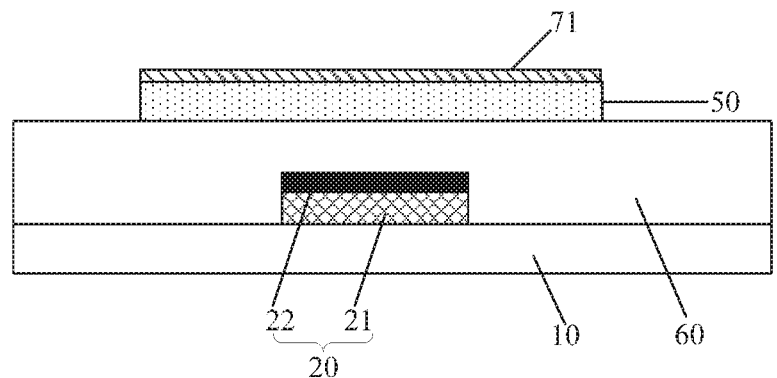

At step S303, an active layer 50 and an ohmic intermediate pattern 71 are formed, as shown in FIG. 12d.

At step S304, the source 30 and the drain 40 are formed by steps S304a and S304b.

Figure 12E:
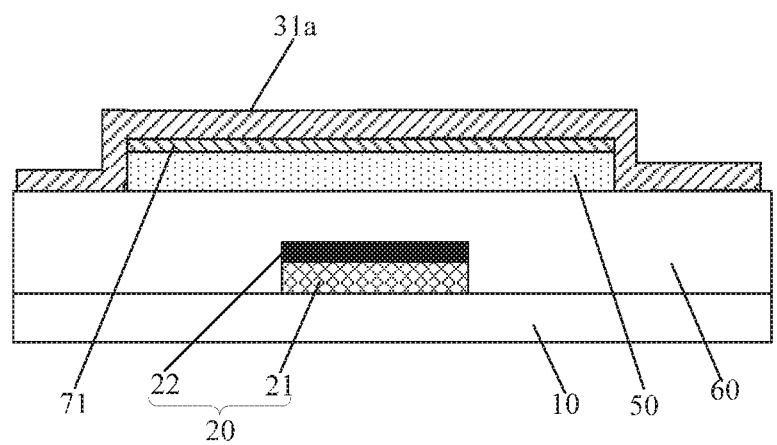

At step S304a, a source/drain metal layer 31a is formed, as shown in FIG. 12e.

Figure 12F:
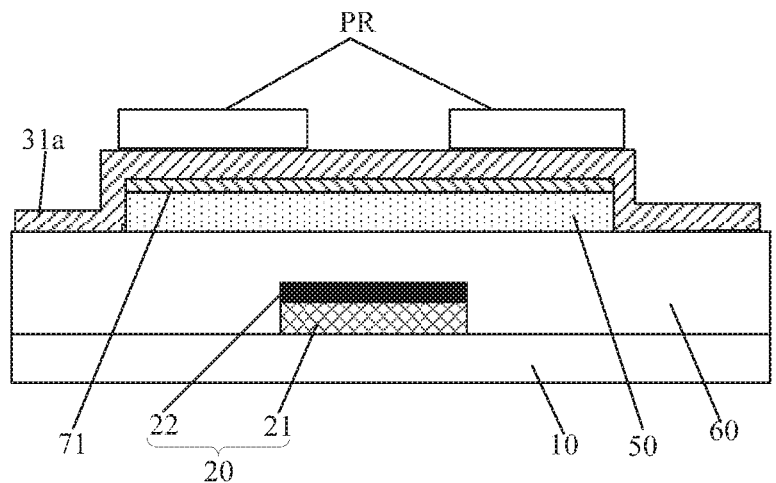
Figure 12G:
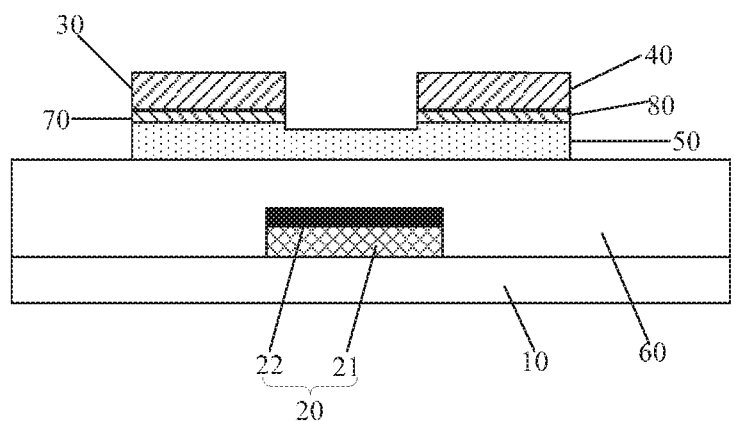
Figure 13:
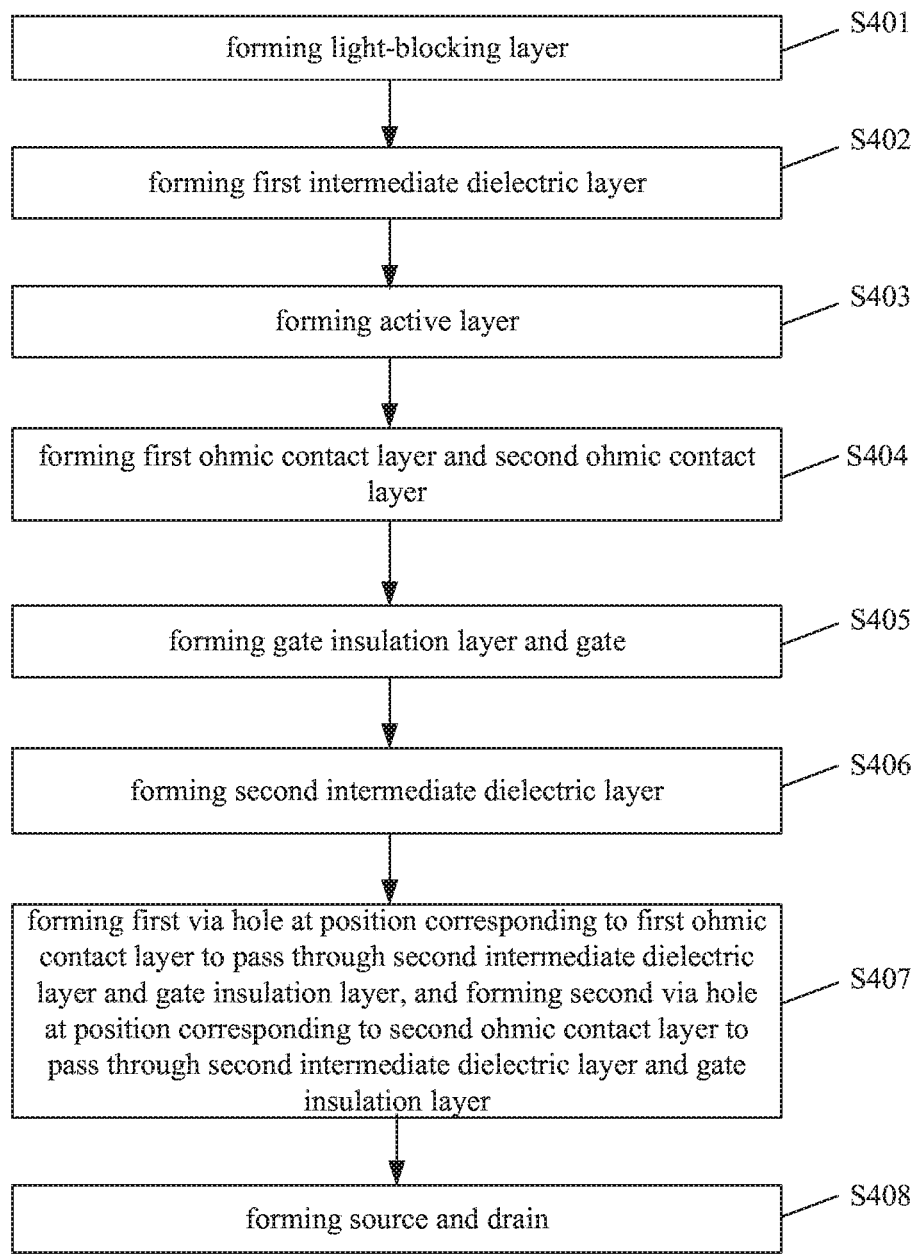
FIG. 13 is a flow chart illustrating a method for manufacturing the thin film transistor shown in FIG. 4 according to an embodiment of the present disclosure.

At step S304b, a patterning process is performed on the source/drain metal layer 31a and the ohmic intermediate pattern 71, to form the source 30, the drain 40, the first ohmic contact layer 70 and the second ohmic contact layer 80. For example, a photoresist layer is formed on the source/drain metal layer 31a; then, an exposure process and a development process are performed on the photoresist layer to retain photoresist PR at regions corresponding to the source and the drain and remove photoresist at other regions, as shown in FIG. 12f; then the source/drain metal layer 31a and the ohmic intermediate pattern 71 are etched; finally, remaining photoresist is removed, to form the electrode body 31 of the source 30, the electrode body 41 of the drain 40, the light-absorbing layer 32 of the source 30, the light-absorbing layer 42 of the drain 40, the first ohmic contact layer 70 and the second ohmic contact layer 80, as shown in FIG. 12g.

The method for manufacturing the thin film transistor of the bottom-gate type is described as above, and a method for manufacturing a thin film transistor of a top-gate type is similar to that for manufacturing the thin film transistor of the bottom-gate type. The difference therebetween is that the steps of forming the gate 20, the source 30 and the drain 40 are all performed after the step of forming the active layer 50 in the method for manufacturing the thin film transistor of the top-gate type. In addition, in order to prevent light from the bottom of the base substrate 10 being directly irradiated onto the active layer 50, the method for manufacturing the thin film transistor of the top-gate type may also include a step of forming a light-blocking layer.

The method for manufacturing the thin film transistor of the top-gate type will be described below taking the thin film transistor shown in FIG. 4 as an example. In the method for manufacturing the thin film transistor shown in FIG. 4, the gate 20, the source 30 and the drain 40 are all the light-absorbing electrodes, and as shown in FIGS. 13, 14a to 14i, the method for manufacturing the thin film transistor may include steps S401 to S408.

Figure 14A:
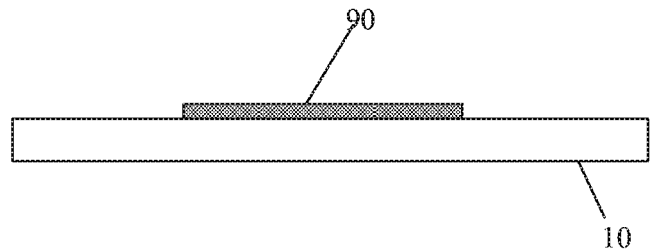
FIGS. 14a to 14i are schematic views illustrating structures firmed by various steps of the method for manufacturing the thin film transistor shown in FIG. 4 according to an embodiment of the present disclosure.

At step S401, a light-blocking layer 90 is formed, as shown in FIG. 14a.

Figure 14B:
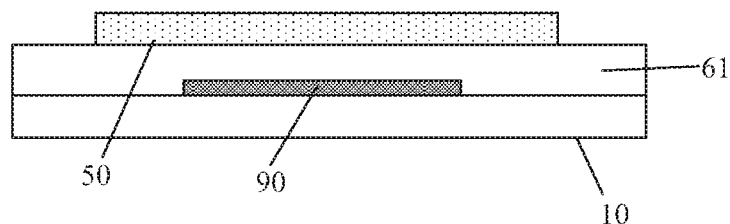

At step S402, a first intermediate dielectric layer 61 is formed, as shown in FIG. 14b.

Figure 14C:
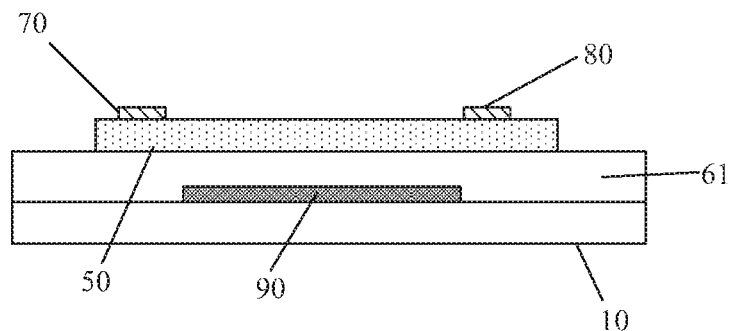

At step S403, an active layer 50 is formed, as shown in FIG. 14c.

At step S404, a first ohmic contact layer 70 and a second ohmic contact layer 80 are formed, as shown in FIG. 14c.

Figure 14D:
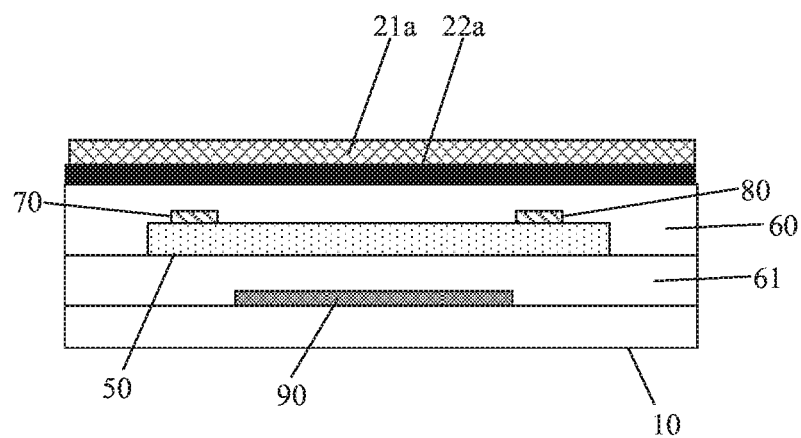
Figure 14E:
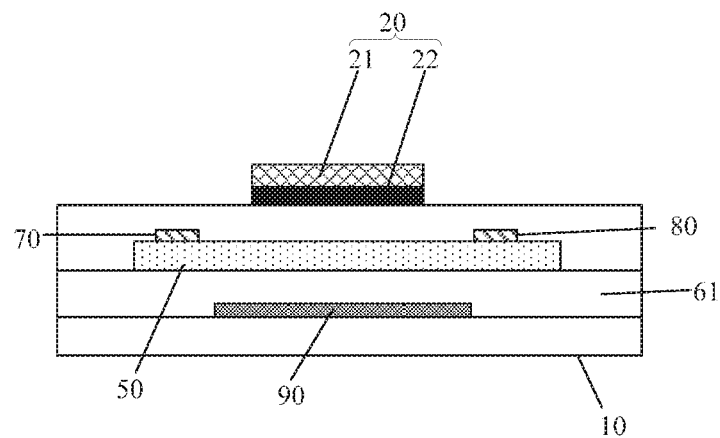

At step S405, a gate insulation layer 60 and the gate 20 are formed. The gate 20 is formed by sequentially forming a first light-absorbing material layer 22a and forming a gate metal layer 21a (i.e. the gate metal layer 21 is above the first light-absorbing material layer 22a), as shown in FIG. 14d, a structure of the first light-absorbing material layer 22a and how to form the first light-absorbing material layer 22a being the same as those in the method for manufacturing the thin film transistor shown in FIG. 1 and not repeatedly described here; then performing a patterning process on the gate metal layer 21a and the first light-absorbing material layer 22a to form the electrode body 21 and the light-absorbing layer 22 of the gate 20, the light-absorbing layer 22 being below the electrode body 21, as shown in FIG. 14e.

Figure 14F:
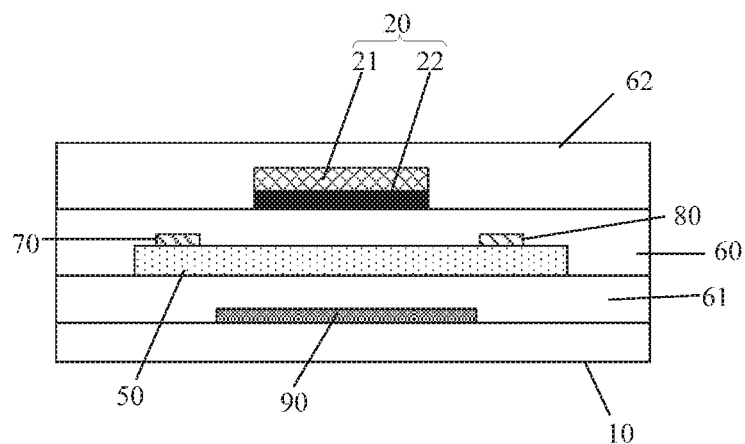

At step S406, a second intermediate dielectric layer 62 is formed, as shown in FIG. 14f.

Figure 14G:
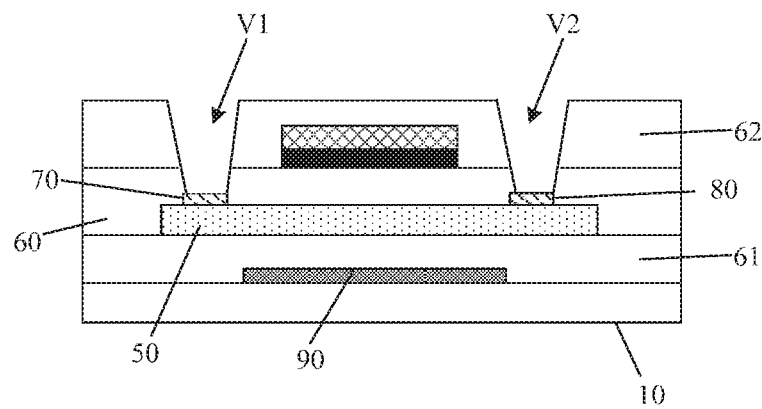

At step S407, a first via hole V1 is formed at a position corresponding to the first ohmic contact layer 70 to pass through the second intermediate dielectric layer 62 and the gate insulation layer 60, and a second via hole V2 is formed at a position corresponding to the second ohmic contact layer 80 to pass through the second intermediate dielectric layer 62 and the gate insulation layer 60, as shown in FIG. 14g.

Figure 14H:
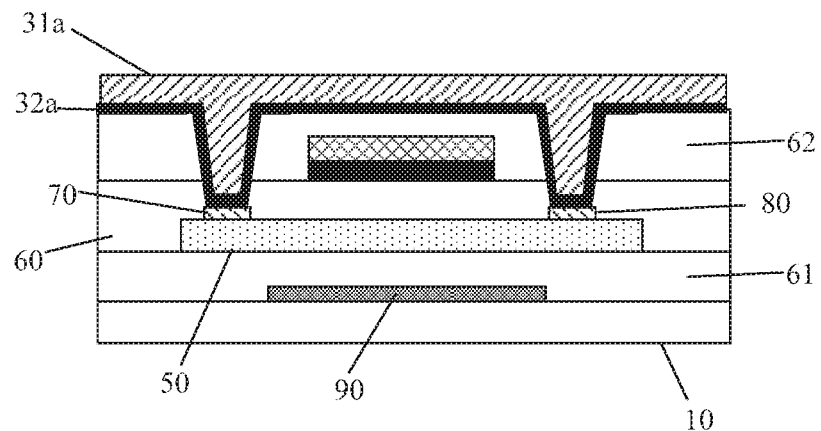
Figure 14I:
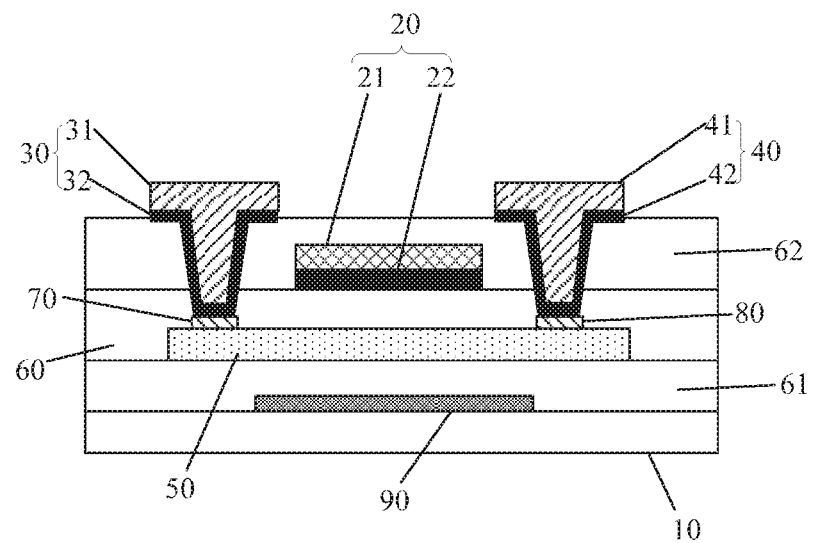

At step 408, the source 30 and the drain 40 are formed. The step S408 may include sequentially forming a second light-absorbing material layer 32a and a source/drain metal layer 31a, as shown in FIG. 14h; then performing a patterning process on the source/drain metal layer 31a and the second light-absorbing material layer 32a to form the electrode body 31 of the source 30, the electrode body 41 of the drain 40, the light-absorbing layer 32 of the source 30 and the light-absorbing layer 42 of the drain 40, as shown in FIG. 14i. A structure of the second light-absorbing layer 32a and how to form the second light-absorbing layer 32a are the same as those in the method for manufacturing the thin film transistor shown in FIG. 1, and the related descriptions are omitted herein.

As for the other two structures of the thin film transistors of the top-gate type (for example the structures shown in FIGS. 5 and 6), the manufacturing methods therefor are similar to the method for manufacturing the thin film transistor shown in FIG. 4. As for the thin film transistor shown in FIG. 5, the gate 20 is not the light-absorbing electrode, and the light-absorbing layer is not included, thus the method for manufacturing the thin film transistor shown in FIG. 5 is different from the method for manufacturing the thin film transistor shown in FIG. 4 in that, in the method for manufacturing the thin film transistor shown in FIG. 5, when forming the gate, the gate metal layer 21a is formed and patterned without forming the light-absorbing material layer 22a, and except this, other steps in the method for manufacturing the thin film transistor shown in FIG. 5 are the same as those in the method for manufacturing the thin film transistor shown in FIG. 4, thus are not repeatedly described herein. As for the thin film transistor shown in FIG. 6, the source 30 and the drain 40 are not the light-absorbing electrodes, and thus the method for manufacturing the thin film transistor shown in FIG. 6 is different from the method for manufacturing the thin film transistor shown in FIG. 4 in that, in the method for manufacturing the thin film transistor shown in FIG. 6, when forming the source 30 and the drain 40, the source/drain metal layer 31a is formed and patterned without forming the light-absorbing material layer 32a, and except this, other steps in the method for manufacturing the thin film transistor shown in FIG. 6 are the same as those in the method for manufacturing the thin film transistor shown in FIG. 4, thus are not repeatedly described herein.

Figure 15:
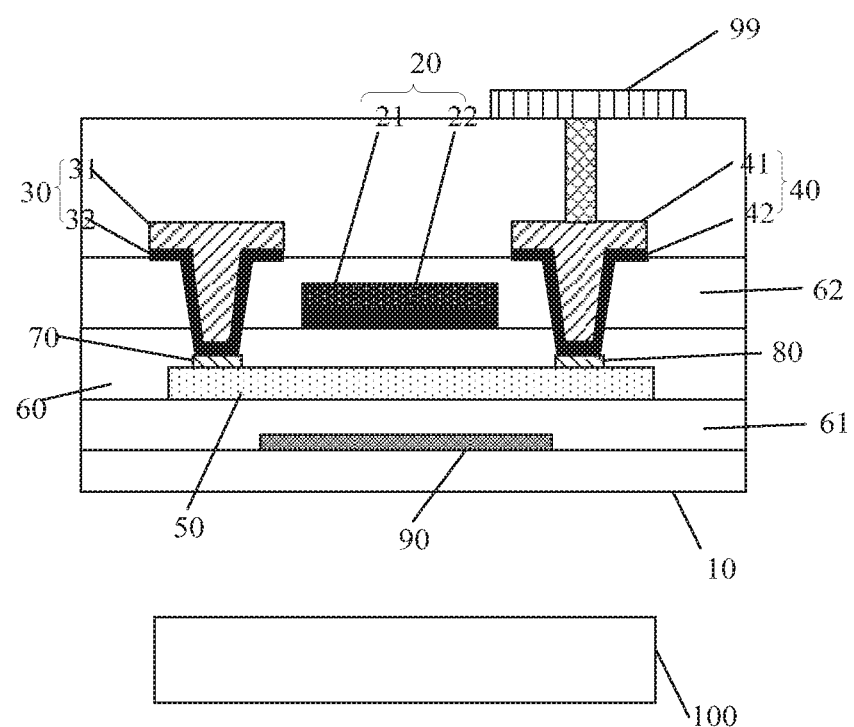
FIG. 15 is a schematic view of a structure of a display apparatus according to an embodiment of the present disclosure.

As another aspect of the present disclosure, an array substrate is provided, and includes the above thin film transistor and a pixel electrode 99 electrically connected to the drain of the thin film transistor, as shown in FIG. 15.

The present disclosure also provides a display apparatus including the above array substrate and a backlight 100, as shown in FIG. 15. The display apparatus may be a liquid crystal display apparatus, and in particular, may be any product or component having a display function, such as a mobile phone, a tablet computer, a television, a display, a notebook computer, a digital photo frame, a navigator, and the like.

Since the above thin film transistor may reduce the amount of light reflected by electrodes such as the source, the drain and the gate to the active layer, the stability of the thin film transistor may be improved. Thus, the array substrate including the above thin film transistor may have a good stability, and accordingly the display apparatus including the array substrate may have a good display effect.

It should be understood that, the above embodiments are only exemplary embodiments for the purpose of explaining the principle of the present disclosure, and the present disclosure is not limited thereto. For one of ordinary skill in the art, various variants and modifications may be made without departing from the spirit and essence of the present disclosure. These variants and modifications also fall within the protection scope of the present disclosure.

What is claimed is:

1. A method for manufacturing a thin film transistor, comprising:
    forming a gate, an active layer, a source and a drain on a base substrate such that the source and the drain each are electrically connected to the active layer, and at least one of the gate, the source and the drain is a light-absorbing electrode,
    wherein the light-absorbing electrode is formed by following steps:
    forming an electrode body, and
    forming a light-absorbing layer at a side of the electrode body facing towards the active layer,
    wherein the light-absorbing layer comprises at least one of a poly (3,4-ethylenedioxythiophene):polystyrene sulfonic acid film, and a poly (3,4-ethylenedioxythiophene):polystyrene sulfonic acid-carbon black composite film,
    wherein the light-absorbing material layer comprises the poly(3,4-ethylenedioxythiophene):polystyrene sulfonic acid film, and the step of forming the light-absorbing layer comprises following steps:
    preparing poly (3,4-ethylenedioxythiophene)-polystyrene sulfonic acid aqueous solution;
    coating the poly (3,4-ethylenedioxythiophene)-polystyrene sulfonic acid aqueous solution; and
    curing the coated poly (3,4-ethylenedioxythiophene)-polystyrene sulfonic acid aqueous solution to form the poly (3,4-ethylenedioxythiophene):polystyrene sulfonic acid film.

2. The manufacturing method of claim 1, wherein each of the gate, the source and the drain is the light-absorbing electrode, the light-absorbing layer of which is a conductive layer.

3. A method for manufacturing a thin film transistor, comprising:
    forming a gate, an active layer, a source and a drain on a base substrate such that the source and the drain each are electrically connected to the active layer, and at least one of the gate, the source and the drain is a light-absorbing electrode,
    wherein the light-absorbing electrode is formed by following steps:
    forming an electrode body, and
    forming a light-absorbing layer at a side of the electrode body facing towards the active layer,
    wherein the light-absorbing layer comprises at least one of a poly (3,4-ethylenedioxythiophene):polystyrene sulfonic acid film, and a poly (3,4-ethylenedioxythiophene):polystyrene sulfonic acid-carbon black composite film,
    wherein the light-absorbing material layer comprises a poly(3,4-ethylenedioxythiophene):polystyrene sulfonic acid-carbon black composite film, and the step of forming the light-absorbing material layer comprises following steps:
    preparing carbon black mixture solution which comprises poly(3,4-ethylenedioxythiophene)-polystyrene sulfonic acid dispersion, carbon black and dopant, the dopant comprising ethylene glycol or glycerol;
    coating the carbon black mixture solution; and
    curing the coated carbon black mixture solution to form the poly (3,4-ethylenedioxythiophene):polystyrene sulfonic acid carbon black composite film.

4. The manufacturing method of claim 1, wherein the gate is formed before the active layer is formed, and the source and the drain each are formed after the active layer is formed.

5. The manufacturing method of claim 1, wherein the gate, the source and the drain are all formed after the active layer is formed.

6. The manufacturing method of claim 3, wherein each of the gate, the source and the drain is the light-absorbing electrode, the light-absorbing layer of which is a conductive layer.

7. The manufacturing method of claim 3, wherein the gate is formed before the active layer is formed, and the source and the drain each are formed after the active layer is formed.

8. The manufacturing method of claim 3, wherein the gate, the source and the drain are all formed after the active layer is formed.

* * * * *